(12) United States Patent
Fujii

(10) Patent No.: US 8,304,267 B2
(45) Date of Patent: Nov. 6, 2012

(54) LASER DEVICE, LASER MODULE, SEMICONDUCTOR LASER AND FABRICATION METHOD OF SEMICONDUCTOR LASER

(75) Inventor: Takuya Fujii, Yamanashi (JP)

(73) Assignee: Eudyna Devices Inc., Yamanashi (JP)

(*) Notice: Subject to any disclaimer, the term of this patent is extended or adjusted under 35 U.S.C. 154(b) by 280 days.

(21) Appl. No.: 12/574,988

(22) Filed: Oct. 7, 2009

(65) Prior Publication Data

US 2010/0022044 A1    Jan. 28, 2010

Related U.S. Application Data

(62) Division of application No. 11/616,530, filed on Dec. 27, 2006, now Pat. No. 7,620,093.

(30) Foreign Application Priority Data

Dec. 27, 2005  (JP) .................................. 2005-376050
Nov. 24, 2006  (JP) .................................. 2006-316887

(51) Int. Cl.
  *H01L 33/60*    (2010.01)
  *H01S 5/187*    (2006.01)
(52) U.S. Cl. ................................. 438/32; 257/E33.006
(58) Field of Classification Search .................... 438/32; 257/E33.006
See application file for complete search history.

(56) References Cited

U.S. PATENT DOCUMENTS

| | | | |
|---|---|---|---|
| 4,806,442 A | * | 2/1989 | Shirasaki et al. ................. 430/4 |
| 5,019,519 A | * | 5/1991 | Tanaka et al. .................... 438/31 |
| 5,600,743 A | | 2/1997 | Hillmer |
| 6,411,642 B1 | * | 6/2002 | Mazed .......................... 372/103 |
| 6,608,855 B1 | * | 8/2003 | Hwang et al. ................... 372/96 |

(Continued)

FOREIGN PATENT DOCUMENTS

DE    4432410 A1    3/1996

(Continued)

OTHER PUBLICATIONS

S.L. Woodward, et al., "A DBR Laser Tunable by Resistive Heating", IEEE Photonics Technology Letters, IEEE Service Center, Piscataway, NJ, US, vol. 4, No. 12, Dec. 1, 1992, pp. 1330-1332.

(Continued)

*Primary Examiner* — George Fourson, III
(74) *Attorney, Agent, or Firm* — Westerman, Hattori, Daniels & Adrian, LLP

(57) ABSTRACT

A semiconductor laser has first and second diffractive grating regions. The first diffractive grating region has segments, has a gain, and has first discrete peaks of a reflection spectrum. The second diffractive grating region has segments combined to each other, and has second discrete peaks of a reflection spectrum. Each segment has a diffractive grating and a space region. Pitches of the diffractive grating are substantially equal to each other. A wavelength interval of the second discrete peaks is different from that of the first discrete peaks. A part of a given peak of the first discrete peaks is overlapped with that of the second discrete peaks when a relationship between the given peaks of the first discrete peaks and the second discrete peaks changes. A first segment located in the first diffractive grating region or the second diffractive grating region has an optical length shorter or longer than the other segments of the first diffractive grating region and the second diffractive grating region by odd multiple of half of the pitch of the diffractive grating of the first diffractive grating region.

4 Claims, 17 Drawing Sheets

U.S. PATENT DOCUMENTS

| | | |
|---|---|---|
| 7,130,124 B2 * | 10/2006 | Ketterson et al. ............ 359/569 |
| 2003/0128724 A1 | 7/2003 | Morthier |
| 2004/0057484 A1 * | 3/2004 | Aoyagi et al. ................. 372/45 |
| 2004/0218639 A1 | 11/2004 | Oh et al. |
| 2010/0290489 A1 * | 11/2010 | Agresti et al. ................. 372/26 |

FOREIGN PATENT DOCUMENTS

| | | |
|---|---|---|
| JP | 2105488 A | 4/1990 |
| JP | 9-270568 A | 10/1997 |
| JP | 9-312437 A | 12/1997 |
| JP | 11150324 A | 6/1999 |
| JP | 2003-318483 A | 11/2003 |
| JP | 2004-336002 A | 11/2004 |

OTHER PUBLICATIONS

European Search Report dated May 3, 2007, Application No. 01627181.3-2222.

Japanese Office Action dated Apr. 13, 2010, issued in corresponding Japanese Patent Application No. 2006-316887.

* cited by examiner

US 8,304,267 B2

LASER DEVICE, LASER MODULE, SEMICONDUCTOR LASER AND FABRICATION METHOD OF SEMICONDUCTOR LASER

CROSS-REFERENCE TO RELATED APPLICATIONS

This application is a divisional application of Ser. No. 11/616,530, filed Dec. 27, 2006, which is based upon and claims the benefit of priority from the prior Japanese Patent Application No. 2005-376050, filed Dec. 27, 2005 and Japanese Patent Application No. 2006-316887, filed Nov. 24, 2006, the entire contents of which are hereby incorporated by reference.

BACKGROUND OF THE INVENTION

1. Field of the Invention

This invention generally relates to a laser device, a laser module, a semiconductor laser and a fabrication method of the semiconductor laser.

2. Description of the Related Art

Generally, a wavelength-changeable semiconductor laser has a semiconductor element having a gain for a laser and a wavelength-selectable semiconductor element. The semiconductor laser has, for example, a Sampled Grating Distributed Feedback Laser (SG-DFB) region and a Sampled Grating Distributed Reflector (SG-DR) region.

The semiconductor laser emits a desirable laser light with use of a vernier effect. That is, the laser light is emitted at a wavelength where a longitudinal mode spectrum of the SG-DFB region corresponds to a reflection spectrum of the SG-DR region, in the semiconductor laser. Therefore, it is possible to emit a desirable laser by controlling the longitudinal mode spectrum of the SG-DFB region and the reflection spectrum of the SG-DR region.

In the semiconductor laser, a phase difference of 90 degrees is, however, generated between a light incoming to the SG-DR region and the SG-DFB region and a light reflected by a diffractive grating of the SG-DR region and the SG-DFB region in a design wavelength range of the diffractive grating. Therefore, a phase difference of 180 degrees is generated between lights transmitting in a resonator in directions opposite to each other, in the design wavelength range. Accordingly, a desirable wavelength light is canceled and it is possible that a laser is not emitted.

On the other hand, the phase difference in the diffractive grating is offset from 90 degrees at a wavelength offset to shorter wavelength or longer wavelength from the design wavelength of the diffractive grating. And it is possible that a single wavelength laser is not emitted.

SUMMARY OF THE INVENTION

The present invention provides a semiconductor laser that can emit a laser at a desirable wavelength.

According to an aspect of the present invention, preferably, there is provided a semiconductor laser including a first diffractive grating region and a second diffractive grating region. The first diffractive grating region has a plurality of segments combined to each other, has a gain, and has first discrete peaks of a reflection spectrum. Each of the segments has a diffractive grating and a space region. The second diffractive grating region is combined to the first diffractive grating region, has a plurality of segments combined to each other, and has second discrete peaks of a reflection spectrum. Each of the segments has a diffractive grating and a space region. The pitch of the diffractive grating is substantially same as that of the diffractive grating of the first diffractive grating region. A wavelength interval of the second discrete peaks is different from that of the first discrete peaks. A part of a given peak of the first discrete peaks is overlapped with a part of a given peak of the second discrete peaks in a case where a relationship between the given peak of the first discrete peaks and the given peak of the second discrete peaks changes. A first segment located in the first diffractive grating region or the second diffractive grating region has an optical length shorter or longer than the other segments of the first diffractive grating region and the second diffractive grating region by odd multiple of half of the pitch of the diffractive grating of the first diffractive grating region.

With the above-mentioned configuration, a phase of a light incoming to the first diffractive grating region changes by 90 degrees, when the diffractive grating reflects the light. A phase of a light incoming to the second diffractive grating region changes by 90 degrees, when the diffractive grating reflects the light. And, the phase of the light reflected by the diffractive grating of the first diffractive grating region is different from that of the light reflected by the diffractive grating of the second diffractive grating region by 180 degrees. Odd multiple of half of the pitch of the diffractive grating of the first diffractive grating region corresponds to 90 degrees phase difference. Therefore, a phase of a light changes by 180 degrees, when the light travels back and forth in the first segment. Accordingly, a phase difference between lights is substantially zero, the lights traveling in opposite directions in the first diffractive grating region and the second diffractive grating region. And the semiconductor laser emits a laser of a desirable wavelength, when a part of the given peak of the first discrete peaks is overlapped with a part of the given peaks of the second discrete peaks.

According to another aspect of the present invention, preferably, there is a fabrication method of a semiconductor laser. The method includes coating a resist on a semiconductor layer, exposing a diffractive grating pattern to the resist, exposing a pattern having a plurality of space regions to the resist and transferring a resist pattern formed by developing the resist to the semiconductor layer, the diffractive grating pattern having a convex portion or a concave portion of an optical length that is odd multiple of a pitch of a diffractive grating, the space region separating the diffractive grating pattern.

With the above-mentioned configuration, the resist is coated on the semiconductor layer. The diffractive grating pattern is exposed to the resist. The pattern corresponding to the space regions is exposed to the resist. The resist pattern is transferred to the semiconductor layer. In this case, it is possible to fabricate a semiconductor laser that has a diffractive grating pattern having a convex portion or a concave portion, the optical length of the convex portion or the concave portion being odd multiple of half of the pitch of a diffractive grating According to another aspect of the present invention, preferably, there is provided a laser module including a semiconductor laser, a reflection spectrum changeable portion and a terminal. The semiconductor laser has a first diffractive grating region and a second diffractive grating region. The first diffractive grating region has a plurality of segments combined to each other, has a gain, and has first discrete peaks of a reflection spectrum. The second diffractive grating region is combined to the first diffractive grating region, has a plurality of segments combined to each other, and has second discrete peaks of a reflection spectrum. Each of the segments has a diffractive grating and a space region. A pitch of the diffractive grating of the second diffractive grating region is substantially same as that of the first diffractive grating region. A wavelength interval of the second discrete peaks is different from that of the first discrete peaks. A part of a given peak of the first discrete peaks is overlapped with a part of a given peak of the second discrete peaks in a case where a relationship between the given peak of the first discrete peaks and the given peak of the second discrete peaks changes. The reflection spectrum changeable portion changes at least either the first discrete peaks or the second discrete peaks. The terminal is for controlling the reflection spectrum changeable portion. A first segment located in the first diffractive grating region or the second diffractive grating region has an optical length shorter or longer than the other segments of the first diffractive grating region and the second diffractive grating region by odd multiple of half of the pitch of the diffractive grating of the first diffractive grating region.

With the above-mentioned configuration, a phase of a light incoming to the first diffractive grating region changes by 90 degrees, when the diffractive grating reflects the light. A phase of a light incoming to the second diffractive grating region changes by 90 degrees, when the diffractive grating reflects the light. And, the phase of the light reflected by the diffractive grating of the first diffractive grating region is different from that of the light reflected by the diffractive grating of the second diffractive grating region by 180 degrees. Odd multiple of half of the pitch of the diffractive grating of the first diffractive grating region corresponds to 90 degrees phase difference. Therefore, a phase of a light changes by 180 degrees, when the light travels back and forth in the first segment. Accordingly, a phase difference between lights is substantially zero, the lights traveling in opposite directions in the first diffractive grating region and the second diffractive grating region. Further, it is possible to control the discrete peaks of the first diffractive grating region and the second diffractive grating region, when the reflection spectrum changeable portion is controlled from outside through the terminal. And the semiconductor laser emits a laser of a desirable wavelength.

According to another aspect of the present invention, preferably, there is provided a laser device including a semiconductor laser, a reflection spectrum changeable portion and a controller. The semiconductor laser has a first diffractive grating region and a second diffractive grating region. The first diffractive grating region has a plurality of segments combined to each other, has a gain, and has first discrete peaks of a reflection spectrum. The second diffractive grating region is combined to the first diffractive grating region, has a plurality of segments combined to each other, and has a second discrete peaks of a reflection spectrum. Each of the segments has a diffractive grating and a space region. A pitch of the diffractive grating of the second diffractive grating region is substantially same as that of the first diffractive grating region. A wavelength interval of the second discrete peaks is different from that of the first discrete peaks. A part of a given peak of the first discrete peaks is overlapped with a part of a given peak of the second discrete peaks in a case where a relationship between the given peak of the first discrete peaks and the given peak of the second discrete peaks changes. The reflection spectrum changeable portion changes at least either the first discrete peaks or the second discrete peaks. The controller controls the reflection spectrum changeable portion. A first segment located in the first diffractive grating region or the second diffractive grating region has an optical length shorter or longer than the other segments of the first diffractive grating region and the second diffractive grating region by odd multiple of half of the pitch of the diffractive grating of the first diffractive grating region.

With the above-mentioned configuration, a phase of a light incoming to the first diffractive grating region changes by 90 degrees, when the diffractive grating reflects the light. A phase of a light incoming to the second diffractive grating region changes by 90 degrees, when the diffractive grating reflects the light. And, the phase of the light reflected by the diffractive grating of the first diffractive grating region is different from that of the light reflected by the diffractive grating of the second diffractive grating region by 180 degrees. Odd multiple of half of the pitch of the diffractive grating of the first diffractive grating region corresponds to 90 degrees phase difference. Therefore, a phase of a light changes by 180 degrees, when the light travels back and forth in the first segment. Accordingly, a phase difference between lights is substantially zero, the lights traveling in opposite directions in the first diffractive grating region and the second diffractive grating region. Further, it is possible to control the discrete peaks of the first diffractive grating region and the second diffractive grating region, when the controller controls the reflection spectrum changeable portion. And the semiconductor laser emits a laser of a desirable wavelength.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

Figure 1:
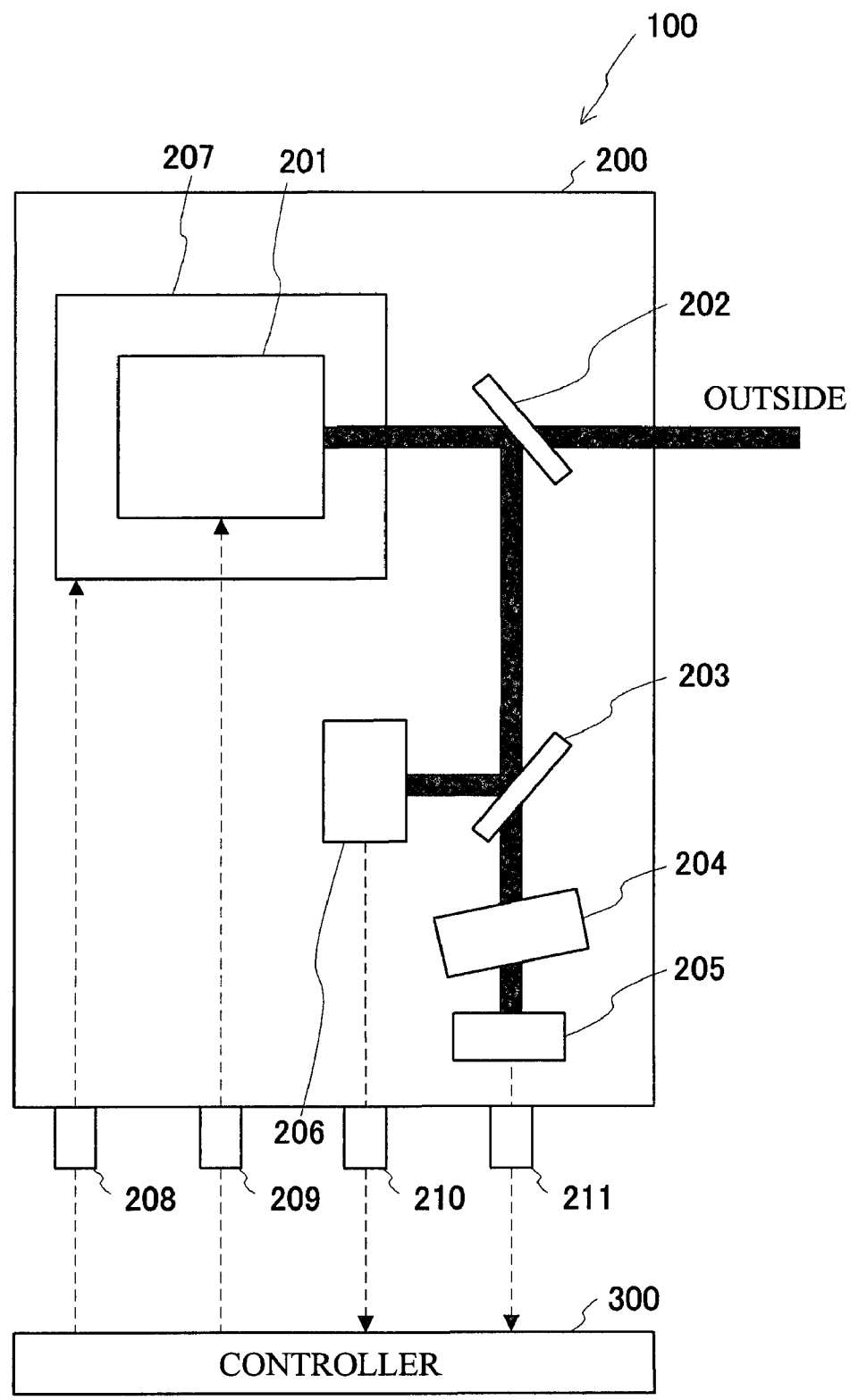
FIG. 1 illustrates a schematic view of a laser device in accordance with a first embodiment of the present invention.

FIG. 1 illustrates a schematic view of a laser device 100 in accordance with a first embodiment of the present invention. As shown in FIG. 1, the laser device 100 has a laser module 200 and a controller 300. The laser module 200 has a semiconductor laser 201, beam splitters 202 and 203, a rocking etalon 204, optical detector elements 205 and 206, a temperature control device 207 and terminals 208 through 211. The semiconductor laser 201 is provided on the temperature control device 207.

The semiconductor laser 201 emits a laser having a given wavelength. A part of a laser light from the semiconductor laser 201 is reflected by the beam splitter 202 and is provided to the beam splitter 203. The rest of the laser light from the semiconductor laser 201 transmits the beam splitter 202 and is emitted toward outside. A part of the laser light from the beam splitter 202 is reflected by the beam splitter 203 and is provided to the optical detector element 206. The rest of the laser light from the beam splitter 202 transmits the beam splitter 203 and is provided to the rocking etalon 204. The laser light provided to the rocking etalon 204 has wavelength peaks at a given period and is provided to the optical detector element 205.

The optical detector element 205 measures an optical intensity of a light from the rocking etalon 204. The optical detector element 205 converts the measured result into an electrical signal and provides the electrical signal to the controller 300 through the terminal 211. The optical detector element 206 measures an optical intensity of a light from the beam splitter 203. The optical detector element 206 converts the measured result into an electrical signal and provides the electrical signal to the controller 300 through the terminal 210.

The controller 300 has a Central Processing Unit (CPU), a Random Access Memory (RAM), a Read Only Memory (ROM) and so on. The ROM of the controller 300 stores control information and a control program of the semiconductor laser 201. The controller 300 detects an emission wavelength of the semiconductor laser 201 according to the measured result from the optical detector element 205. The controller 300 controls the temperature control device 207 and the semiconductor laser 201 according to a ratio of the measured result of the optical detector element 205 and the measured result of the optical detector element 206. In this case, the controller 300 provides an electrical signal to the semiconductor laser 201 through the terminal 209 and provides an electrical signal to the temperature control device 207 through the terminal 208.

Figure 2A:
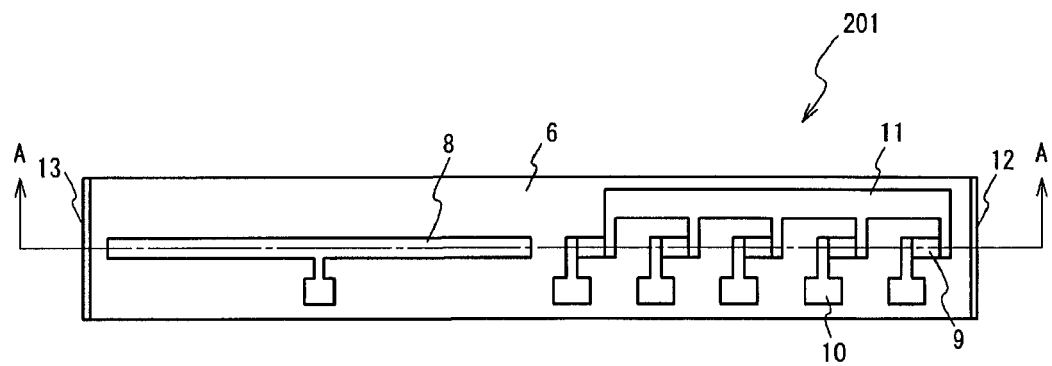
FIG. 2A and FIG. 2B illustrate details of a semiconductor laser.
Figure 2B:
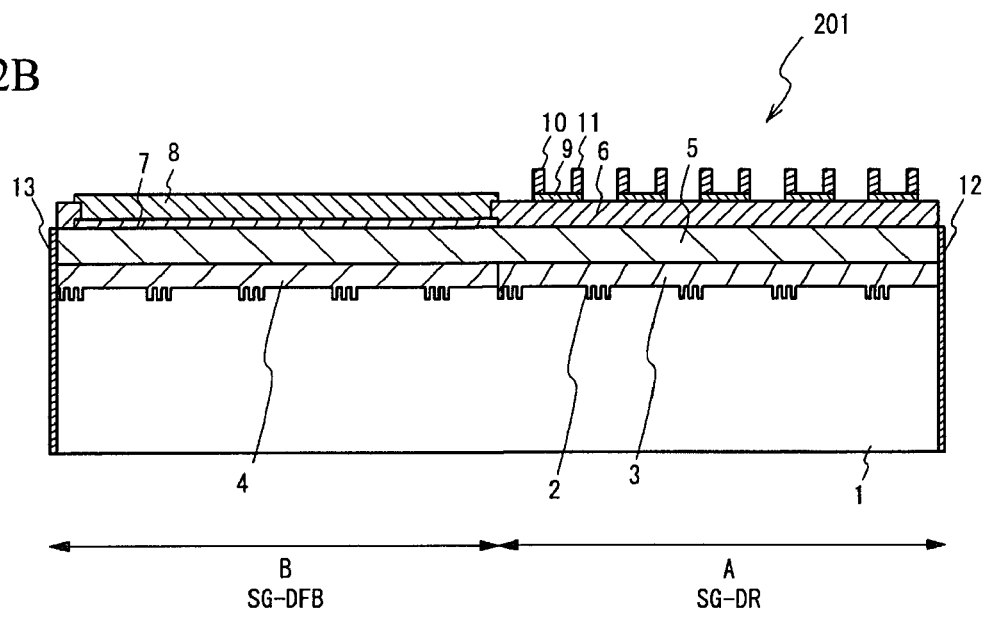

FIG. 2A and FIG. 2B illustrate details of the semiconductor laser 201. FIG. 2A illustrates a top view of the semiconductor laser 201. FIG. 2B illustrates a cross sectional view taken along a line A-A of FIG. 2A. A description will be given, with reference to FIG. 2A and FIG. 2B, of the semiconductor laser 201. As shown in FIG. 2A and FIG. 2B, the semiconductor laser 201 has a structure in which a Sampled Grating Distributed Reflector (SG-DR) region A and a Sampled Grating Distributed Feedback Laser (SG-DFB) region B are coupled in order.

The SG-DR region A has a structure in which a waveguide core 3, a cladding layer 5 and an insulating layer 6 are laminated on a substrate 1 in order and thin film resistors 9, power electrodes 10 and a grand electrode 11 are laminated on the insulating layer 6. The SG-DFB region B has a structure in which a waveguide core 4, the cladding layer 5, a contact layer 7 and an electrode 8 are laminated on the substrate 1 in order. The substrate 1 and the cladding layer 5 of the SG-DR region A and the SG-DFB region B are a single layer formed as a unit respectively. The waveguide cores 3 and 4 are formed on a same plane and form a waveguide core together.

A low reflecting coating 12 is formed on end faces of the substrate 1, the waveguide core 3 and the cladding layer 5 at the SG-DR region A side. On the other hand, a low reflecting coating 13 is formed on end faces of the substrate 1, the waveguide core 4 and the cladding layer 5 at the SG-DFB region B side. Sampled diffractive gratings 2 are formed at a given interval in the waveguide cores 3 and 4. The sampled grating is thus formed.

The substrate 1 is, for example, a semiconductor substrate composed of InP. The waveguide core 3 is, for example, composed of InGaAsP crystalline having an absorption edge wavelength at shorter wavelengths side compared to the laser emission wavelength. PL wavelength of the waveguide core 3 is approximately 1.3 μm. The waveguide core 4 is, for example, an active layer composed of InGaAsP crystalline amplifying a light of a desirable wavelength of a laser emission. The PL wavelength of the waveguide core 4 is approximately 1.57 μm.

The coupling constant of the sampled diffractive grating 2 is approximately 200 cm$^{-1}$. The pitch λ of the sampled diffractive grating 2 is approximately 0.24 μm. The number of asperity of the sampled diffractive grating 2 is approximately 17. The refractive index of the sampled diffractive grating 2 is approximately 3.2. The length of the sampled diffractive grating 2 is approximately 4 μm. The bragg wavelength of the sampled diffractive grating 2 is approximately 1.55 μm. In this case, the reflectivity against the bragg wavelength of the sampled diffractive grating 2 is approximately less than 1%.

Five SG-DR segments are formed in the waveguide core 3. Here, the SG-DR segment is a region in which one region having the sampled diffractive grating 2 and one space region not having the sampled diffractive grating 2 are combined in the waveguide core 3. Each optical length of the SG-DR segments is substantially equal to each other. "Substantially equal" means that differences between each length of the space regions are less than 1% of the average length of the space regions.

In general, it is possible to enhance an interference effect of light reflected by the sampled diffractive grating 2, when the number of the SG-DR segments is increased. And a mode stability of a laser emission is thus improved. However, element length is increased if the number of the SG-DR segments is increased. In addition, the mode stability is saturated because of an internal loss in the waveguide core 3, when total length of the waveguide core 3 is over 2 mm. It is, therefore, preferable that the number of the SG-DR segments is approximately 5. Each length of the SG-DR segments is, for example, 270 μm.

Five SG-DFB segments are formed in the waveguide core 4. Here, the SG-DFB segment is a region in which one region having the sampled diffractive grating 2 and one space region not having the sampled diffractive grating 2 are combined in the waveguide core 4. And the SG-DFB segment has a gain. The number of the SG-DFB segments is preferably as same as that of the SG-DR segments, and is, for example, 5. Each length of the SG-DFB segments is substantially equal to each other, and is, for example, 240 μm. "Substantially equal" means that differences between each length of the space regions are approximately less than 1% of the average length of the space regions.

The cladding layer 5 is composed of InP, constricts a current and confines a laser light traveling in the waveguide cores 3 and 4. The contact layer 7 is composed of InGaAsP crystalline. The insulating layer 6 is a protection film composed of an insulator such as SiN or $SiO_2$. The low reflecting coatings 12 and 13 are, for example, composed of a dielectric film including $MgF_2$ and TiON. The reflectivity of the low reflecting coatings 12 and 13 is, for example, less than 0.3%.

The thin film resistor 9 is composed of such as NiCr, and controls each temperature of the SG-DR segments according to the intensity of a current provided from the controller 300 in FIG. 1. Each of the thin film resistors 9 is formed on the insulating layer 6 above each of the SG-DR segments respectively. Each of the power electrodes 10 is coupled to each of the thin film resistors 9. The grand electrode 11 is coupled to each of the thin film resistor 9. The power electrodes 10, the grand electrode 11 and the electrode 8 are composed of a conductive material such as Au.

Next, a description will be given of an operation of the semiconductor laser 201. At first, a given current is provided to the electrode 8 from the controller 300 in FIG. 1. And a light is generated in the waveguide core 4. The light propagates in the waveguide cores 3 and 4, is reflected and amplified repeatedly, and is emitted toward outside.

The controller 300 can control an emission wavelength of the semiconductor laser 201. The controller 300 provides a given current to the temperature control device 207 in FIG. 1. It is thus possible to control a temperature of the semiconductor laser 201 to be a given value. And it is possible to control a local maximum peak reflectivity of the waveguide core 4. Further, the controller 300 provides a given current to each of the thin film resistors 9. In this case, it is possible to control the temperature of the SG-DR segments separately. The refractive index of each of the SG-DR segments is changed to be a given value. Therefore, it is possible to control the local maximum peak reflectivity of the waveguide core 3. And the controller 300 can control the emission wavelength of the semiconductor laser 201.

Figure 3:
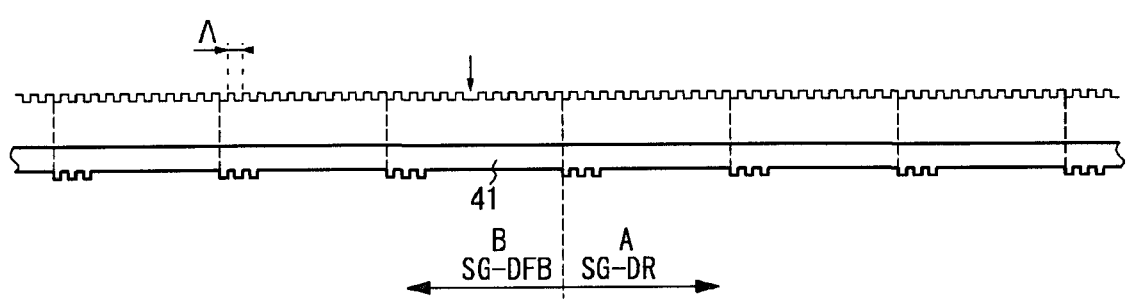
FIG. 3 illustrates details of each of segments in waveguide cores.

FIG. 3 illustrates details of each of the segments in the waveguide cores 3 and 4. As shown in FIG. 3, a space region of a segment 41 has an optical length longer or shorter than that of segments other than the segment 41 by odd multiple of half of the pitch λ of the sampled diffractive grating 2. The segment 41 is one of the SG-DR segments and the SG-DFB segments. The segments other than the segment 41 have an optical length that is integral multiple of the pitch λ of the sampled diffractive grating 2. In the embodiment, the optical lengths of the segments other than the segment 41 are substantially equal to each other, and the optical length of the space region of the segment 41 is longer than the other segments by half of the pitch λ of the sampled diffractive grating 2.

In this case, a phase of a light incoming to each of the SG-DR segments changes by 90 degrees, when the sampled diffractive grating 2 reflects the light. On the other hand, a phase of a light incoming to each of the SG-DFB segments changes by 90 degrees, when the sampled diffractive grating 2 reflects the light. And, the phase of the light reflected by the sampled diffractive grating 2 of the SG-DR segment is different from that of the light reflected by the sampled diffractive grating 2 of the SG-DFB segment by 180 degrees. Odd multiple of half of the pitch λ corresponds to 90 degrees phase difference. Therefore, a phase of a light changes by 180 degrees, when the light travels back and forth in the segment 41. Accordingly, a phase difference between lights is substantially zero, the lights traveling in opposite directions in the waveguide cores 3 and 4. And the semiconductor laser 201 can emit a laser of a desirable wavelength.

The optical length of the sampled diffractive grating 2 of the segment 41 may be longer or shorter than the sampled diffractive grating 2 of other segments by odd multiple of half of the pitch λ of the sampled diffractive grating 2. In this case, the optical length of the space region of the segment 41 is substantially same as that of other segments. FIG. 4A through FIG. 4D illustrate details of the sampled diffractive grating 2 of the segment 41.

Figure 4A:
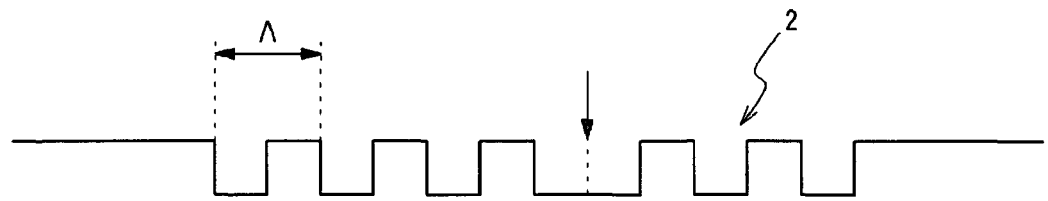
FIG. 4A through FIG. 4D illustrate details of sampled diffractive grating of a segment.
Figure 4B:
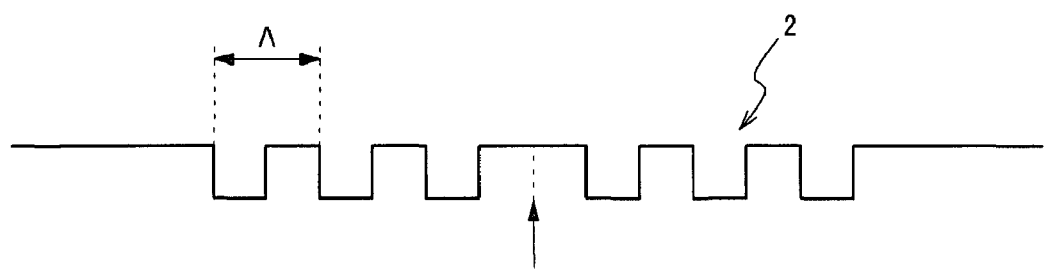
Figure 4C:
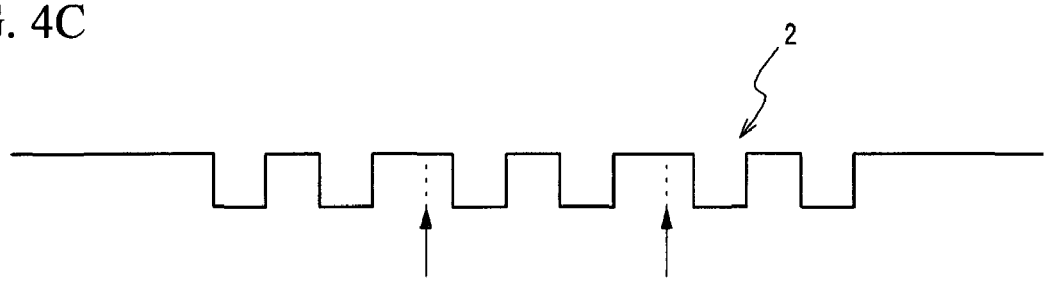
Figure 4D:
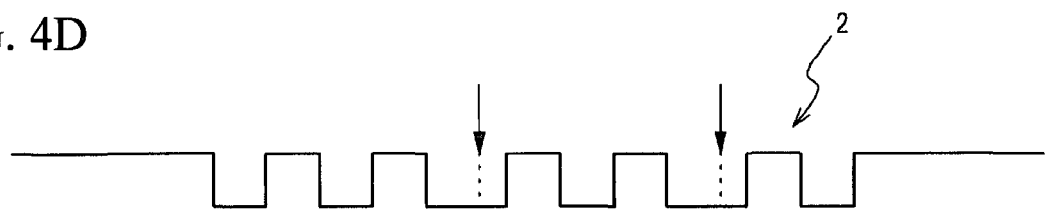

In FIG. 4A, one of concave portions of the sampled diffractive grating 2 of the segment 41 has an optical length longer than the other concave portions by half of the pitch λ. In FIG. 4B, one of convex portions of the sampled diffractive grating 2 of the segment 41 has an optical length longer than the other convex portions by half of the pitch λ. In FIG. 4C, two of the concave portions of the sampled diffractive grating 2 of the segment 41 have an optical length longer than the other concave portions by one-fourth of the pitch λ. In FIG. 4D, two of the convex portions of the sampled diffractive grating 2 of the segment 41 have an optical length longer than the other convex portions by one-fourth of the pitch λ.

In cases of FIG. 4A through FIG. 4D, a phase of a light changes by 180 degrees, when the light travels back and forth in the segment 41. Therefore, a phase difference between lights is substantially zero, the lights traveling in opposite directions in the waveguide cores 3 and 4. And the semiconductor laser 201 can emit a laser of a desirable wavelength.

Figure 5:
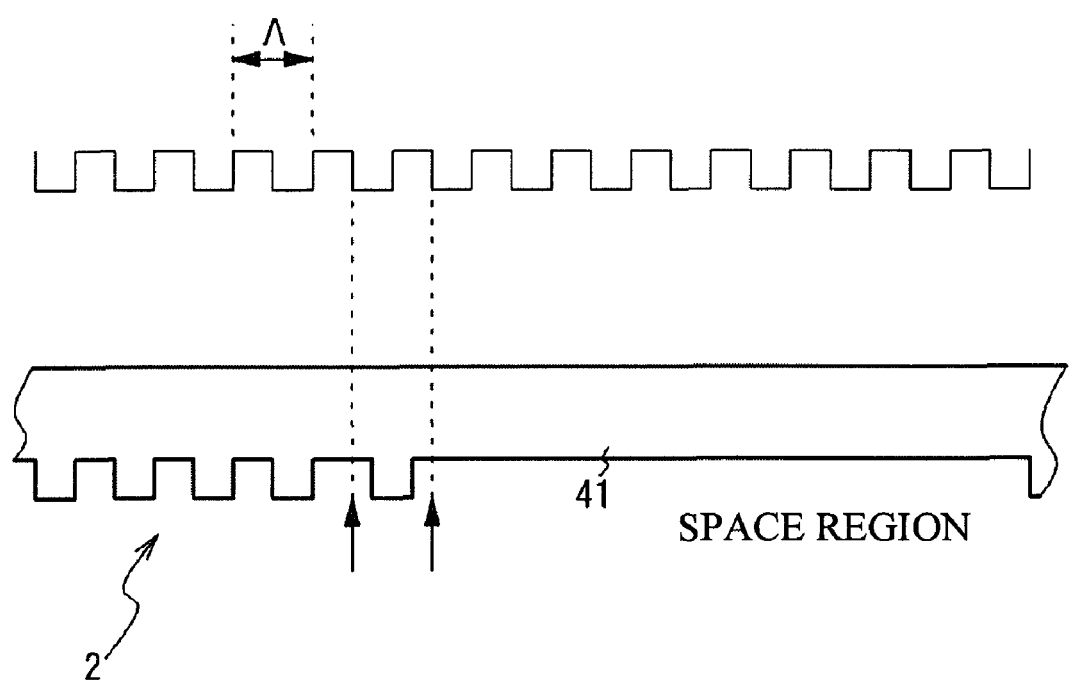
FIG. 5 illustrates details of a sampled diffractive grating of a segment.

The optical length difference between the segment 41 mentioned above and the other segments may be distributed into the space region of the segment 41 and the sampled diffractive grating 2. FIG. 5 illustrates the details. As shown in FIG. 5, one of the concave portions and the convex portions of the sampled diffractive grating 2 of the segment 41 has an optical length longer than the other concave portions and the other convex portions by one-fourth of the pitch λ. And the space region of the segment 41 has an optical length longer than the other concave portions and the other convex portions by one-fourth of the pitch λ. In this case, a phase of a light changes by 180 degrees, when the light travels back and forth in the segment 41. Therefore, a phase difference between lights is substantially zero, the lights traveling in opposite directions in the waveguide cores 3 and 4. And the semiconductor laser 201 can emit a laser of a desirable wavelength.

Figure 6:
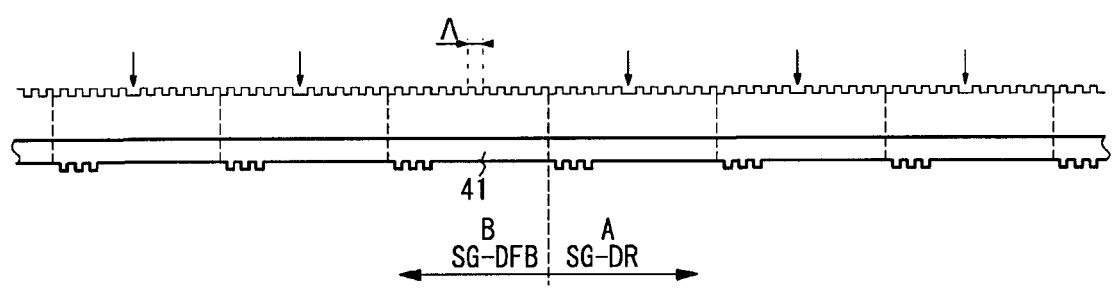
FIG. 6 illustrates details of a sampled diffractive grating of a segment.

The space region of the segment 41 may have an optical length shorter than that of the other segments by odd multiple of half of the pitch λ of the sampled diffractive grating 2. FIG. 6 illustrates the details. As shown in FIG. 6, the space region of the segment 41 has an optical length shorter than that of the other segments by half of the pitch λ of the sampled diffractive grating 2. The segments other than the segment 41 have an optical length that is odd multiple of the pitch λ of the sampled diffractive grating 2. In the embodiment, the optical lengths of the space region of the segments other than the segment 41 are substantially equal to each other.

In this case, a phase of a light changes by 180 degrees, when the light travels back and forth in the segment 41. Therefore, a phase difference between lights is substantially zero, the lights traveling in opposite directions in the waveguide cores 3 and 4. And the semiconductor laser 201 can emit a laser of a desirable wavelength.

It is preferable that the segment 41 mentioned above is one of the two segments of the SG-DR segments and or one of the two segments of the SG-DFB segments that are on the boundary side between the SG-DR region A and the SG-DFB region B. This is because a mirror loss closes to symmetrical at a position between the SG-DR region A and the SG-DFB region B.

Figure 7A:
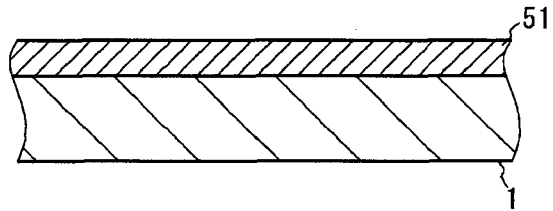
FIG. 7A through FIG. 7F illustrate a flow of a fabrication method of a semiconductor laser.
Figure 7B:
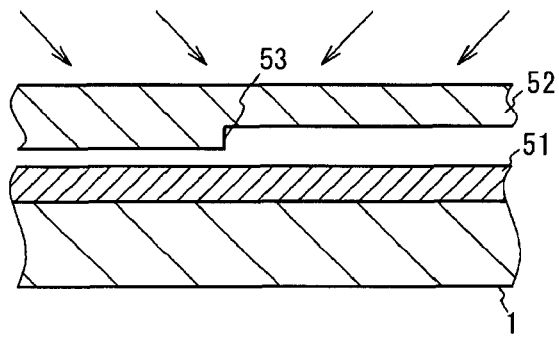
Figure 7C:
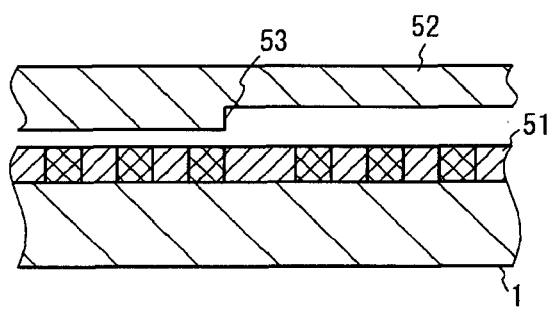

Next, a description will be given of a fabrication method of the semiconductor laser 201. At first, a description will be given of a fabrication method of the semiconductor laser 201 in which the sampled diffractive grating 2 has a different optical length. FIG. 7A through FIG. 7F illustrate a flow of the fabrication method of the semiconductor laser 201. As shown in FIG. 7A, a resist 51 is coated on the substrate 1. Next, as shown in FIG. 7B, a transparent mask 52 such as glass is provided on the resist 51 and the resist 51 is subjected to an interference exposure. The transparent mask 52 has a step 53 formed on the resist 51 side thereof. And a light path length in the transparent mask 52 is changed at the step 53. The step 53 is formed so that an interference fringe changes by half of the pitch λ. And, as shown in FIG. 7C, a part of the resist 51 under the step 53 is not exposed and the rest of the resist 51 is exposed stripedly, the part of the resist 51 being to be a concave portion or a convex portion having an optical length longer than the other concave portions and the other convex portions by half of the pitch λ.

Figure 7D:
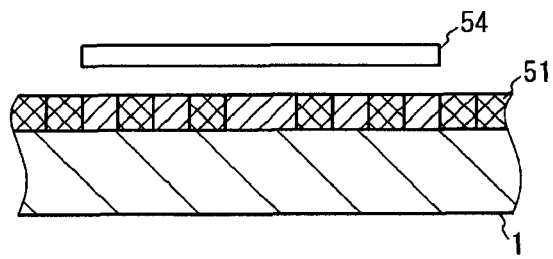
Figure 7E:
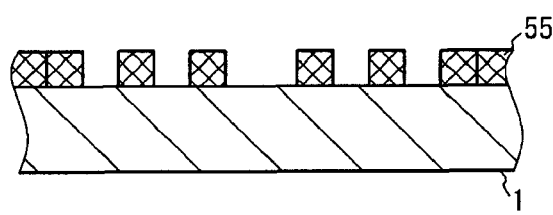
Figure 7F:
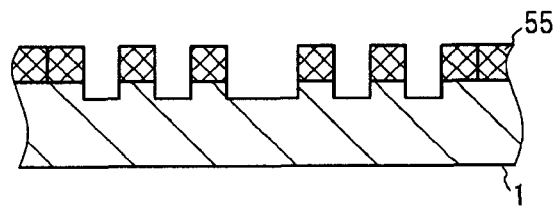

Next, as shown in FIG. 7D, the resist 51 is covered with an exposure mask 54 having an opening corresponding to a part to be the space region, and is exposed. The part corresponding to the space region separating each of the sampled diffractive gratings 2 is exposed. Next, as shown in FIG. 7E, a resist pattern 55 is formed after the part of the resist 51 not exposed is eliminated through an etching treatment. Next, as shown in FIG. 7F, the resist pattern 55 is transferred to the substrate 1 through an etching treatment. Therefore, the sampled diffractive grating 2 and the space region are formed. After that, other layers are formed on the substrate 1. And the semiconductor laser 201 is fabricated.

Figure 8A:
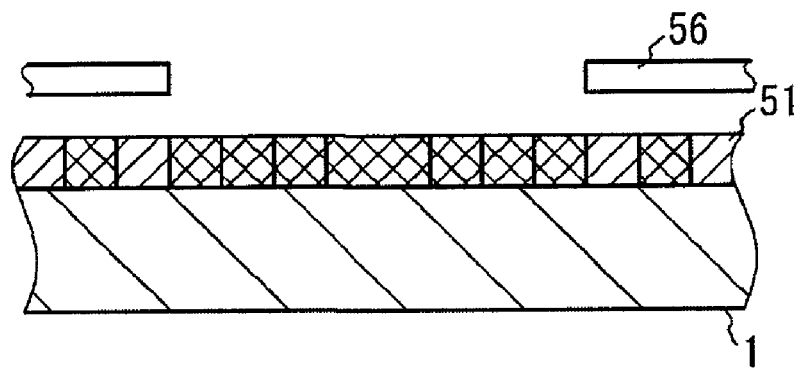
FIG. 8A through FIG. 8C illustrate a flow of a fabrication method of a semiconductor laser.

Next, a description will be given of a fabrication method of the semiconductor laser 201 in which the space region has a different optical length. At first, the steps shown in FIG. 7A through FIG. 7C are processed. Next, as shown in FIG. 8A, the resist 51 is covered with an exposure mask 56. The exposure mask 56 has an opening corresponding to the part to be the space region that has a concave portion or a convex portion having an optical length longer than the other concave portions and the other convex portions by half of the pitch λ, and is exposed. Accordingly, the part corresponding to the space region separating each of the sampled diffractive gratings 2 is exposed.

Figure 8B:
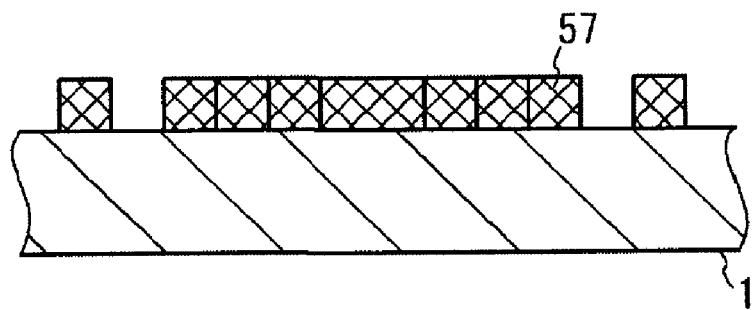
Figure 8C:
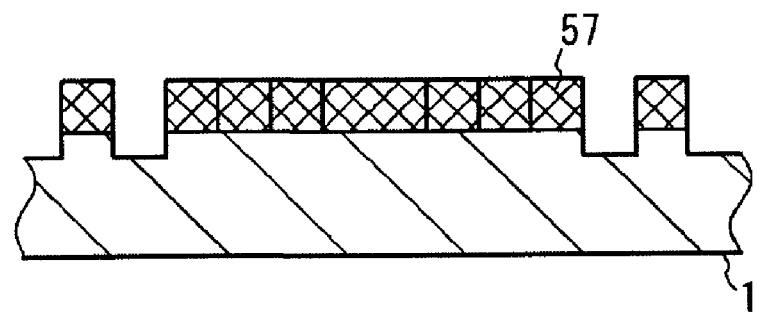

Next, as shown in FIG. 8B, a resist pattern 57 is formed after the part of the resist 51 not exposed is eliminated through an etching treatment. Next, as shown in FIG. 8C, the resist pattern 57 is transferred to the substrate 1 through an etching treatment. Therefore, the sampled diffractive grating 2 and the space region are formed. After that, other layers are formed on the substrate 1. And the semiconductor laser 201 is fabricated.

In the embodiment, the sampled diffractive grating 2 corresponds to the diffractive grating. The SG-DFB region B corresponds to the first diffractive grating region. The SG-DR region A corresponds to the second diffractive grating region. The thin film resistor 9 and the temperature control device 207 correspond to the reflection spectrum changeable portion. The segment 41 corresponds to the first segment. The transparent mask 52 corresponds to the phase-shifting mask. The substrate 1 corresponds to the semiconductor layer. The terminal 209 corresponds to the terminal for controlling the reflection spectrum changeable portion. The terminal 208 corresponds to the terminal for controlling the temperature control device.

(Second Embodiment)

Figure 9:
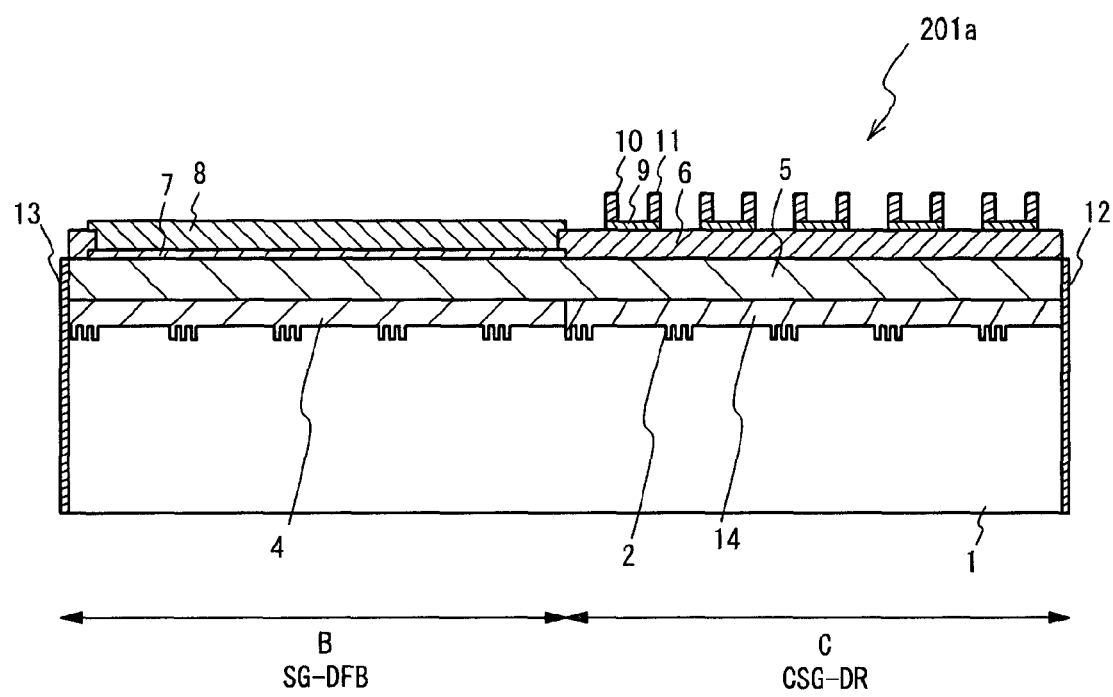
FIG. 9 illustrates a semiconductor laser in accordance with a second embodiment of the present invention.

FIG. 9 illustrates a semiconductor laser 201a in accordance with a second embodiment of the present invention. The semiconductor laser 201a has a Chirped Sampled Grating Distributed Reflector (CSG-DR) region C instead of the SG-DR region A, being different from the semiconductor laser 201 in FIG. 2A and FIG. 2B.

The CSG-DR region C has a waveguide core 14 instead of the waveguide core 3, being different from the SG-DR region A. The waveguide core 14 is, for example, composed of InGaAsP crystalline having an absorption edge wavelength at shorter wavelengths side compared to the laser emission wavelength. PL wavelength of the waveguide core 14 is approximately 1.3 µm. The waveguides cores 4 and 14 are formed on a same plane and form a waveguide core together. A plurality of the sampled diffractive grating 2 is formed at a given interval in the waveguide core 14. The sampled grating is thus formed. Five CSG-DR segments are formed in the waveguide core 14.

Here, the CSG-DR segment is an region in which one region having the sampled diffractive grating 2 and one space region not having the sampled diffractive grating 2 are combined in the waveguide core 14. At least two of the space regions of the CSG-DR segments have an optical length different from each other.

Figure 10:
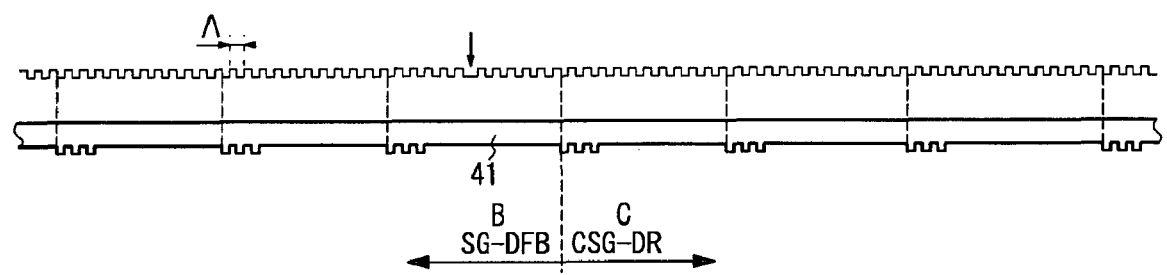
FIG. 10 illustrates details of each of segments in waveguide cores.

FIG. 10 illustrates details of each of the segments in the waveguide cores 14 and 4. As shown in FIG. 10, a segment 41 has an optical length longer or shorter than that of segments other than the segment 41 by odd multiple of half of the pitch λ of the sampled diffractive grating 2. The segment 41 is one of the CSG-DR segments and the SG-DFB segments. The segments other than the segment 41 have an optical length that is integral multiple longer or odd multiple of half of the pitch λ. At least two of the space regions of the CSG-DR segments have an optical length different from each other.

In the embodiment, the lengths of the CSG-DR segments are, for example, 260 µm, 265 µm, 270 µm, 275 µm and 280 µm in order from the SG-DFB region B side. The optical length of each of the CSG-DR segments changes dependent on the length of the space region.

In the semiconductor laser 201a, a peak reflectivity of the waveguide core 14 indicates a local maximum at a given wavelength. It is because the phase of the light traveling back and forth in the CSG-DR segments in the waveguide core 14 is a value of integral multiplication of 2π at the given wavelength. On the other hand, the peak reflectivity of the waveguide core 14 is reduced when the wavelength of the peak reflectivity is as far from the given wavelength. It is because phase-matched superposition does not occur, as the optical longitudinal mode spacings of the segments are slightly different from each other.

The peak reflection intensity of the optical longitudinal mode of the waveguide core 14 has wavelength dependence in the semiconductor laser 201a in accordance with the embodiment. That is, the peak reflection intensity of the optical longitudinal mode of the waveguide core 14 changes according to the wavelength. On the contrary, the peak reflection intensity of the waveguide core 4 does not have wavelength dependence. It is possible to restrain a laser emission within a wavelength range in which the peak reflection intensity of the optical longitudinal mode of the waveguide core 14 is relatively low, and to obtain a stabilized laser emission within a wavelength range in which the peak reflection intensity of the optical longitudinal mode of the waveguide core 14 is relatively high. In addition, it is possible to control the laser emission wavelength easily, when the wavelength range in which the peak reflection intensity of the optical longitudinal mode is relatively high is changed with the change of the refractive-index of the waveguide core 14.

In the embodiment, the CSG-DR region corresponds to the second diffractive grating region.

(Third Embodiment)

Figure 11:
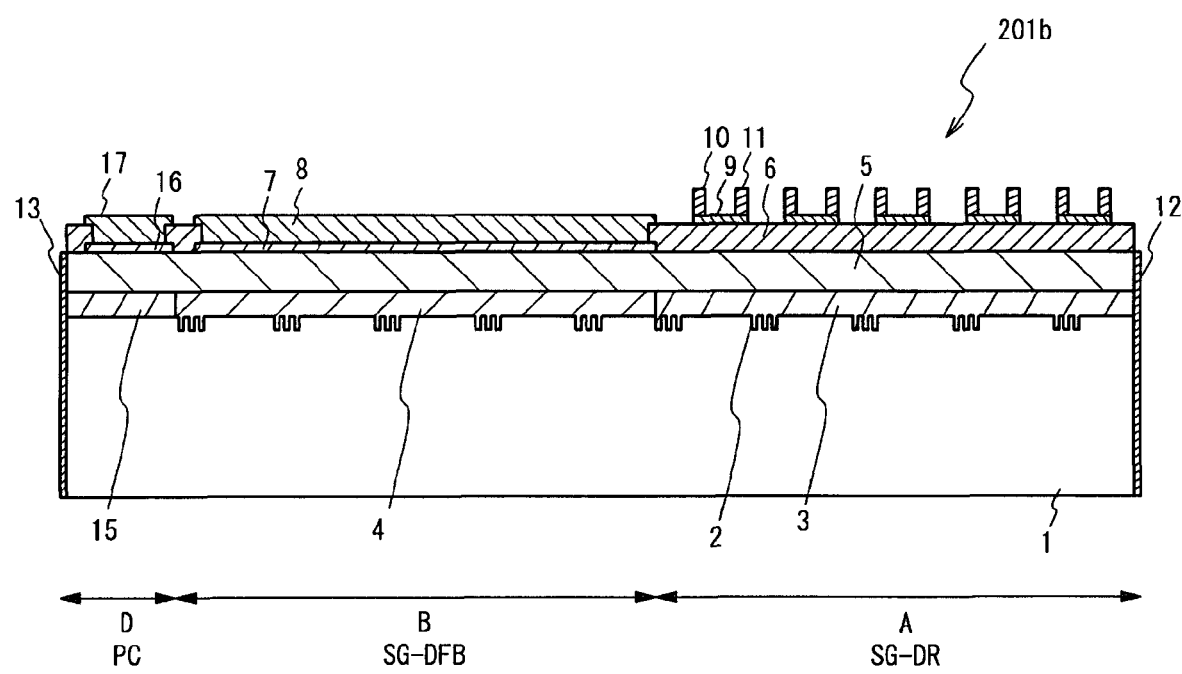
FIG. 11 illustrates a semiconductor laser in accordance with a third embodiment of the present invention.

FIG. 11 illustrates a semiconductor laser 201b in accordance with a third embodiment of the present invention. The semiconductor laser 201b further has a Power Control (PC) region D, being different from the semiconductor laser 201 in FIG. 2A and FIG. 2B. The semiconductor laser 201b has a structure in which the SG-DR region A, the SG-DFB region B and the PC region D are coupled in order.

The PC region D has a structure in which a waveguide core 15, the cladding layer 5, a contact layer 16 and an electrode 17 are laminated on the substrate 1 in order. In the embodiment, the low reflecting coating 13 is formed on end faces of the substrate 1, the waveguide core 15 and the cladding layer 5 at the PC region D side. The substrate 1 and the cladding layer 5 of the SG-DR region A, the SG-DFB region B and the PC region D are a single layer formed as a unit respectively. The waveguides cores 3, 4 and 15 are formed on a same plane and form a waveguide core together. The insulating layer 6 is also formed between the electrode 8 and the electrode 17. The waveguide core 15 is, for example, composed of InGaAsP crystalline changing an intensity of an outputting light by absorbing or amplifying a light. PL wavelength of the waveguide core 15 is approximately 1.57 µm.

Next, a description will be given of an operation of the semiconductor laser 201b. At first, a given current is provided to the electrode 8 from the controller 300 in FIG. 2A and FIG. 2B. And a light is generated in the waveguide core 4. The light is amplified or absorbed, propagates in the waveguide cores 3 and 4, is reflected and amplified repeatedly, and is emitted toward outside. A given current is provided to the electrode 17 from the controller 300. And the output of the emitting light is kept substantially constant. The effect of the present invention is obtained, even if the CSG-DR region C is provided instead of the SG-DR region A.

In the embodiment, the PC region corresponds to the optical absorber or the optical amplifier.

In the embodiments mentioned above, the optical length difference is generated when one of the segments has a physical length different from that of the other segments. In the embodiments below, the optical length difference is generated, when a physical quantity other than the physical length is changed. A description will be give of the details.

(Fourth Embodiment)

Figure 12A:
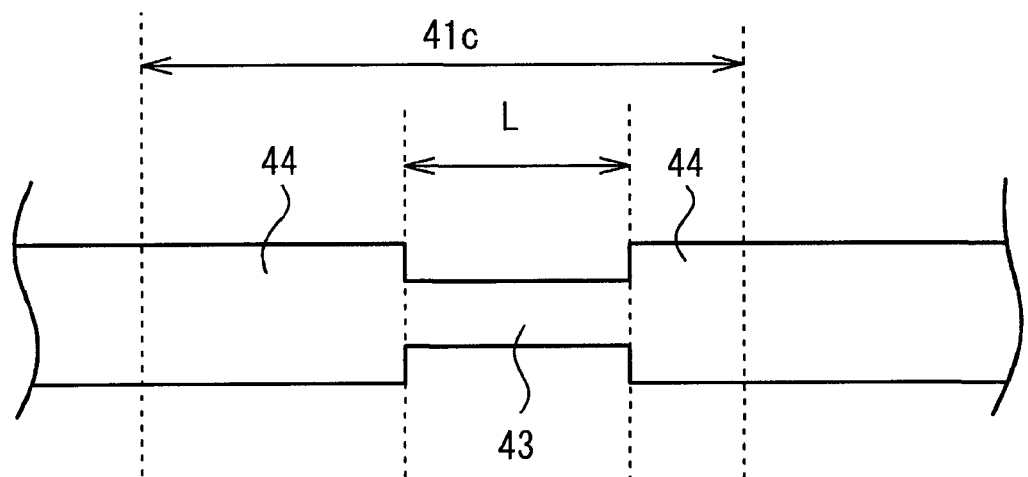
FIG. 12A and FIG. 12B illustrate a segment in accordance with a fourth embodiment of the present invention.
Figure 12B:
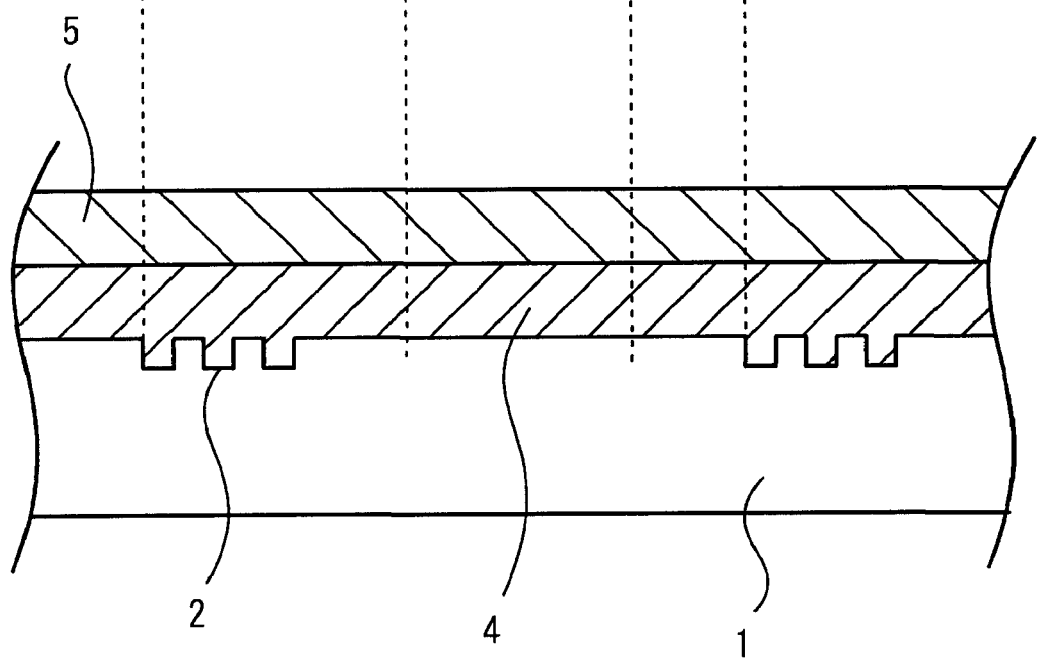

Next, a description will be given of a semiconductor laser 201c in accordance with a fourth embodiment of the present invention. The semiconductor laser 201c has a segment 41c instead of the segment 41, being different from the semiconductor laser 201 shown in FIG. 2A through FIG. 3. The segment 41c has a cross section different from that of the other segments of the waveguide cores 3 and 4. FIG. 12A and FIG. 12B illustrate the details.

FIG. 12A illustrates a top view of each segment in the waveguide cores 3 and 4 viewing from upward. FIG. 12B illustrates a cross sectional view corresponding to FIG. 12A. In the embodiment, the segment 41c is provided in the SG-DFB region B. As shown in FIG. 12A, the space region of the segment 41c has a small width portion 43. The width of the small width portion 43 is smaller than a region other than the small width portion 43 (hereinafter referred to a region 44) in the segment 41c. In this case, an equivalent refractive index difference is generated between the segment 41c and the other segments. Therefore, an optical length difference is generated between the segment 41c and the other segments.

Here, the equivalent refractive index of the small width portion 43 is represented as $n_1$. The equivalent refractive index of the region 44 is represented as $n_2$. The length of the small width portion 43 in the propagating direction of a light is represented as L. In this case, a phase of a light propagating in the segment 41c is changed when the light propagates in the small width portion 43. The phase difference in this case is represented as $\Delta\phi$. And the $\Delta\phi$ is shown as following Expression 1.

$$\Delta\phi = 2\pi n_1 \times L/\lambda - 2\pi n_2 \times L/\lambda \quad \text{(Expression 1)}$$

In the embodiment, $\Delta\phi$ is set so that the optical length difference between the segment 41c and the other segments is odd multiple of half of the pitch λ of the sampled diffractive grating 2. For example, $\Delta\phi$ is set to be $-\pi/2$. In this case, a phase of a light changes by 180 degrees, when the light travels back and forth in the segment 41c. Therefore, a phase difference between lights is substantially zero as in the case of the first embodiment, the lights traveling in opposite directions in the waveguide cores 3 and 4. And the semiconductor laser 201c can emit a laser of a desirable wavelength.

For example, the equivalent refractive index $n_1$ is 3.19922 and the equivalent refractive index $n_2$ is 3.19956, when the width of the small width portion 43 is 1.5 µm, the width of the region 44 is 1.8 µm, and the thickness of the segment 41c is adjusted adequately. In this case, $\Delta\phi$ is $-\pi/2$ when the length L of the small width portion 43 is 100 µm. And in the segment 41c, the length of the space region may be 255 µm to 277 µm, the length of the sampled diffractive grating 2 may be 3 µm to 5 µm, and the length of the segment 41c may be 260 µm to 280 µm.

The small width portion 43 may be divided into several parts in the segment 41c. The segment 41c may be provided in the SG-DR region A or in the SG-DFB region B. It is preferable that the segment 41c is provided at a position closer to the boundary between the SG-DR region A and the SG-DFB region B. The segment 41c may have a small thickness portion instead of the small width portion 43. In this case, it is possible to control the equivalent refractive index by controlling the thickness of the small thickness portion.

Figure 13A:
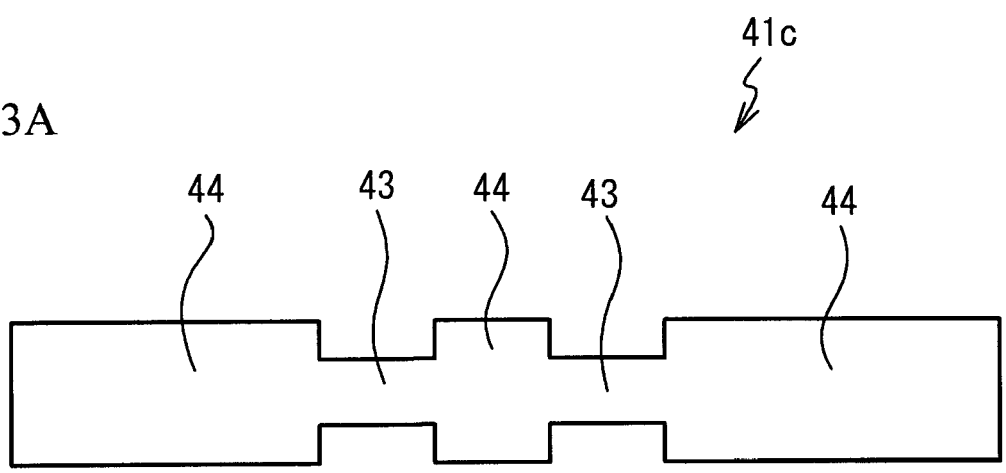
FIG. 13A and FIG. 13B illustrate another segment in accordance with the fourth embodiment.
Figure 13B:
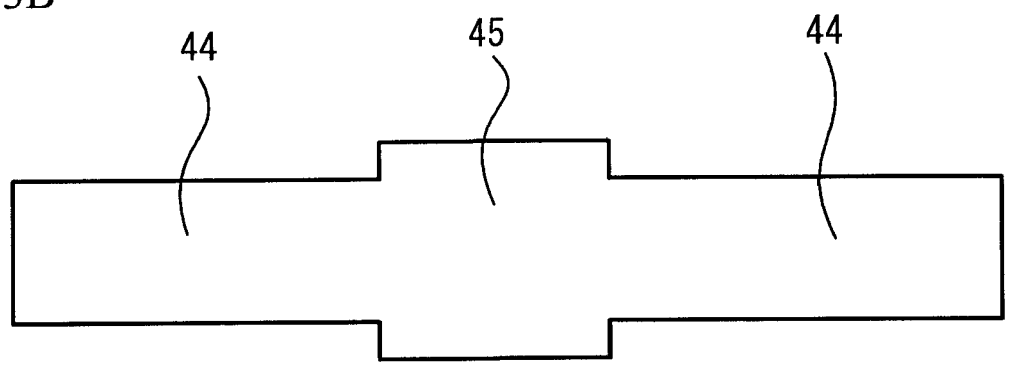

As shown in FIG. 13B, a large width portion 45 having a width larger than that of the region 44 may be provided instead of the small width portion 43, although the phase difference is generated because the small width portion 43 is provided in the segment 41c in the embodiment. In this case, the effect of the present invention is obtained when the equivalent refractive indexes of the region 44 and the large width portion 45 are controlled so that the $\Delta\phi$ is $-\pi/2$. That is, the effect of the present invention is obtained when the segment 41c has a region having cross sectional area different from that of the other region thereof. All of the segments except for one of the SG-DR region A and the SG-DFB region B may be the segment 41c. In this case, a phase of a light changes by 180 degrees, when the light travels back and forth in the segment 41c.

In the embodiment, the segment 41c corresponds to the first segment.

(Fifth Embodiment)

Next, a description will be given of a semiconductor laser 201d in accordance with a fifth embodiment of the present invention. The semiconductor laser 201d has a segment 41d instead of the segment 41, being different from the semiconductor laser 201 shown in FIG. 2A through FIG. 3. The segment 41d has a convex portion projecting downward from a bottom of the space region thereof. The details are shown in FIG. 14.

Figure 14:
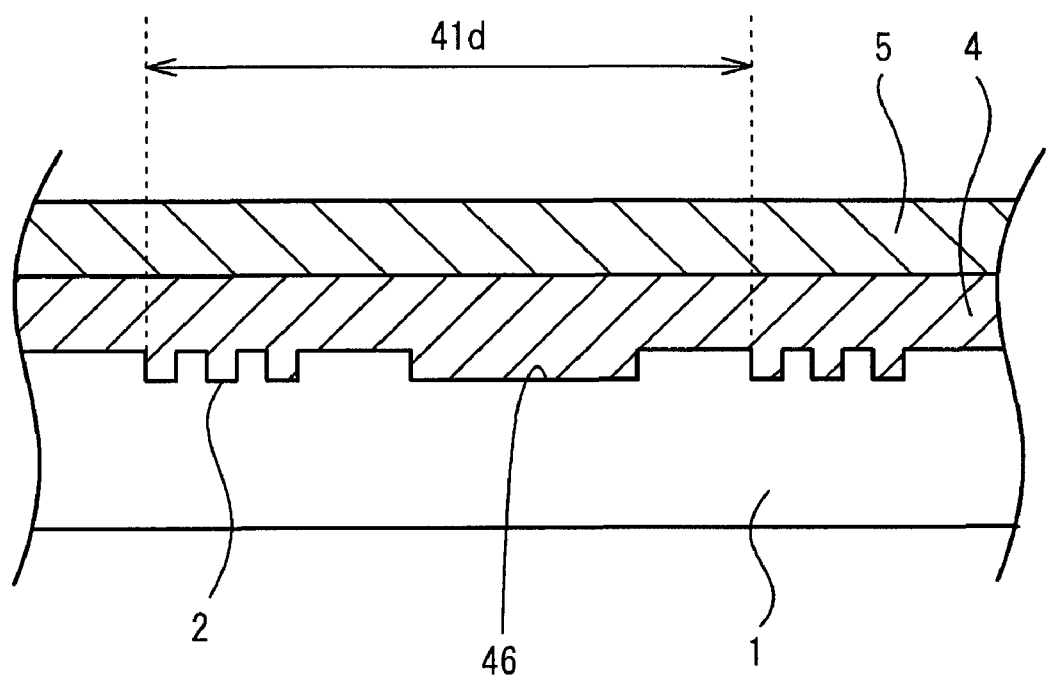
FIG. 14 illustrates a segment in accordance with a fifth embodiment of the present invention.

FIG. 14 illustrates a cross sectional view of each segment of the waveguide cores 3 and 4. In the embodiment, the segment 41d is provided in the SG-DFB region B. As shown in FIG. 14, the space region of the segment 41d has a convex portion 46 projecting toward the substrate 1. In this case, an equivalent refractive index difference is generated between the segment 41d and the other segments. Therefore, an optical length difference is generated between the segment 41d and the other segments.

In the embodiment, Δφ is set so that the optical length difference between the segment 41d and the other segments is odd multiple of half of the pitch λ of the sampled diffractive grating 2. For example, Δφ is set to be −π/2. In this case, a phase of a light changes by 180 degrees, when the light travels back and forth in the segment 41d. Therefore, a phase difference between lights is substantially zero as in the case of the first embodiment, the lights traveling in opposite directions in the waveguide cores 3 and 4. And the semiconductor laser 201d can emit a laser of a desirable wavelength.

For example, the equivalent refractive index $n_1$ of the convex portion 46 is 3.19922 when the height of the convex portion 46 is set to be 0.1 μm. An equivalent refractive index of a region other than the convex portion 46 in the segment 41d is set to be 3.18144. In this case, the Δφ is −π/2 when the height of the convex portion 46 is 20 μm, following Expression 1. And in the segment 41d, the length of the space region may be 255 μm to 277 μm, the length of the sampled diffractive grating 2 may be 3 μm to 5 μm, and the length of the segment 41d may be 260 μm to 280 μm.

Figure 15A:
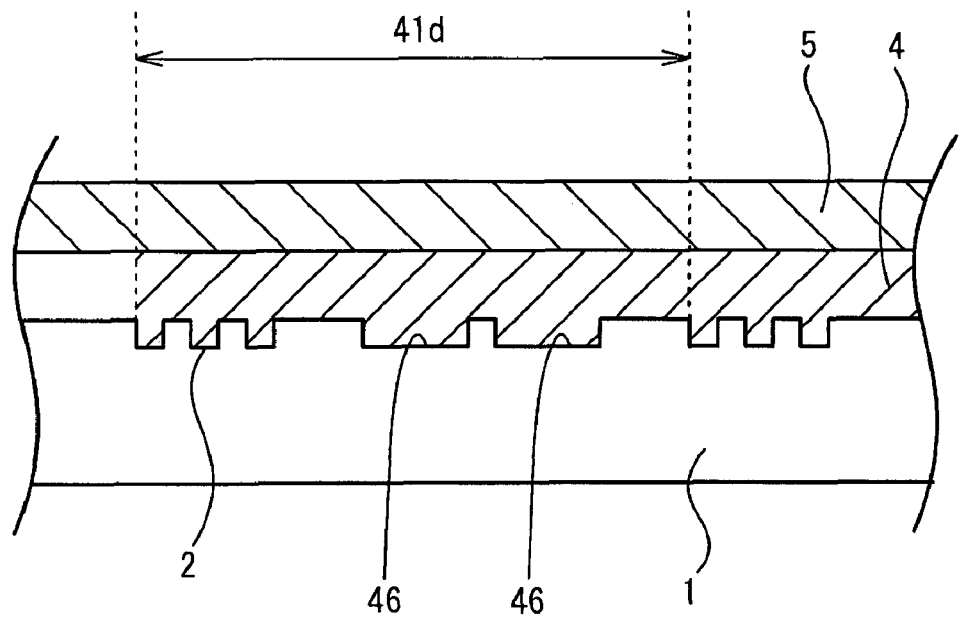
FIG. 15A and FIG. 15B illustrate another segment in accordance with the fifth embodiment.
Figure 15B:
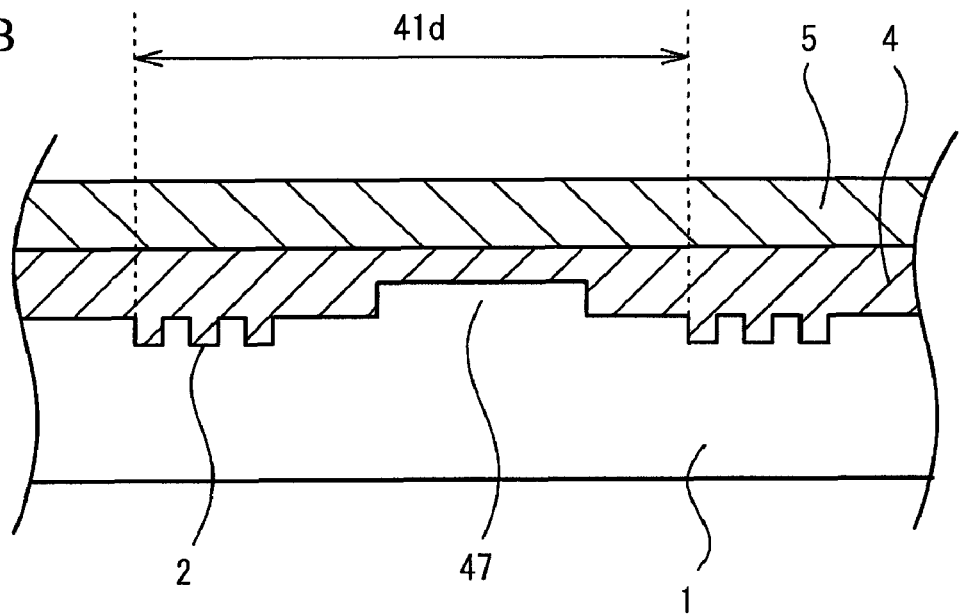

As shown in FIG. 15A, the convex portion 46 may be divided into several parts in the segment 41d. The segment 41d may be provided in the SG-DR region A or in the SG-DFB region B. It is preferable that the segment 41d is provided at a position closer to the boundary between the SG-DR region A and the SG-DFB region B.

The space region of the segment 41d may have a concave portion 47 instead of the convex portion 46 at the bottom thereof. In this case, the substrate 1 may project toward the concave portion 47. In the structure, the effect of the present invention is obtained, when the equivalent refractive index of the concave portion 47 is adjusted so that the Δφ is −π/2. That is, the effect of the present invention is obtained when the segment 41d has a convex portion or a concave portion on the bottom thereof. And, all of the segments except for one of the SG-DR region A and the SG-DFB region B may be the segment 41d. In this case, a phase of a light changes by 180 degrees, when the light travels back and forth in the segment 41d.

In the embodiment, the segment 41d corresponds to the first segment.

(Sixth Embodiment)

Figure 16:
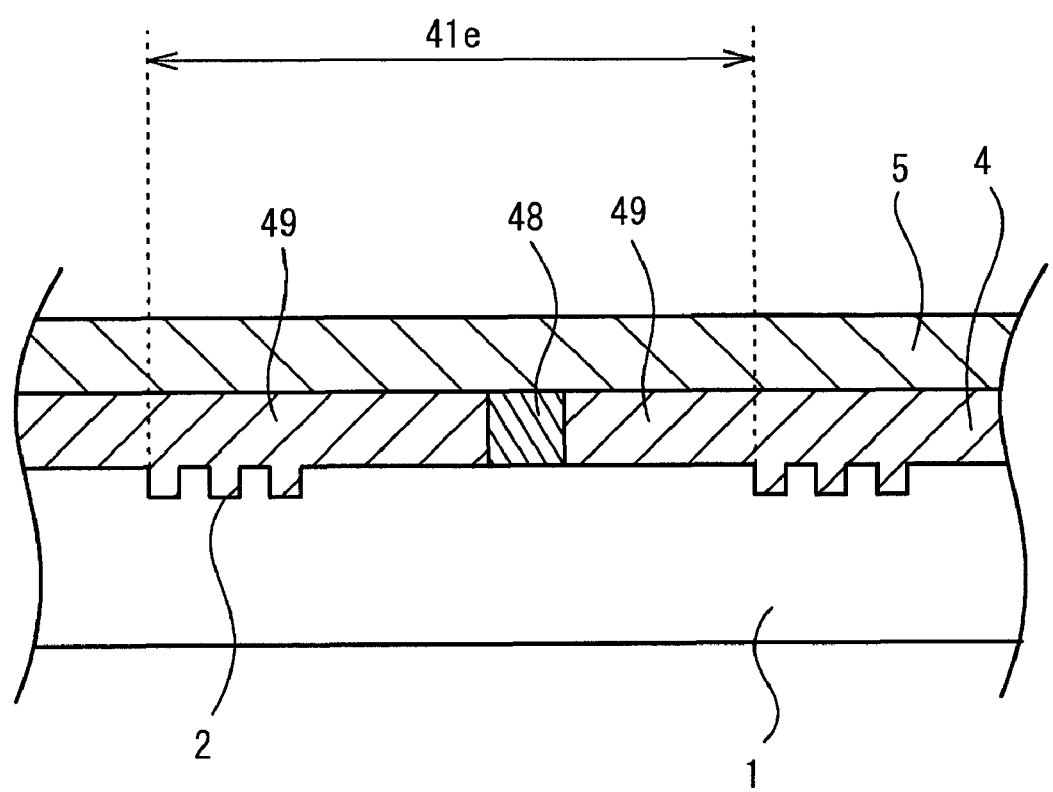
FIG. 16 illustrates a segment in accordance with a sixth embodiment of the present invention.

Next, a description will be given of a semiconductor laser 201e in accordance with a sixth embodiment of the present invention. The semiconductor laser 201e has a segment 41e instead of the segment 41, being different from the semiconductor laser 201 shown in FIG. 2A through FIG. 3. FIG. 16 illustrates a cross sectional view of each segment of the waveguide cores 3 and 4. In the embodiment, the segment 41e is provided in the SG-DFB region B.

As shown in FIG. 16, the segment 41e has a high-refractive-index portion 48. The high-refractive-index portion 48 has a composition different from the other region in the segment 41e (hereinafter referred to a region 49). And the refractive index of the high-refractive-index portion 48 is higher than that of the region 49. In this case, an equivalent refractive index difference is generated between the segment 41e and the other segments. Therefore, an optical length difference is generated between the segment 41e and the other segments.

In the embodiment, Δφ is set so that the optical length difference between the segment 41e and the other segments is odd multiple of half of the pitch λ of the sampled diffractive grating 2. For example, Δφ is set to be −π/2. In this case, a phase of a light changes by 180 degrees, when the light travels back and forth in the segment 41e. Therefore, a phase difference between lights is substantially zero as in the case of the first embodiment, the lights traveling in opposite directions in the waveguide cores 3 and 4. And the semiconductor laser 201e can emit a laser of a desirable wavelength.

For example, the equivalent refractive index of the high-refractive-index portion 48 is 3.20518 when the composition of the high-refractive-index portion 48 is adjusted adequately. An equivalent refractive index of the region 49 is set to be 3.19922, when the composition of the region 49 is adjusted adequately. In this case, the Δφ is −π/2 when the length of the high-refractive-portion 48 is 65 μm, following Expression 1. And in the segment 41e, the length of the space region may be 255 μm to 277 μm, the length of the sampled diffractive grating 2 may be 3 μm to 5 μm, and the length of the segment 41e may be 260 μm to 280 μm.

Figure 17:
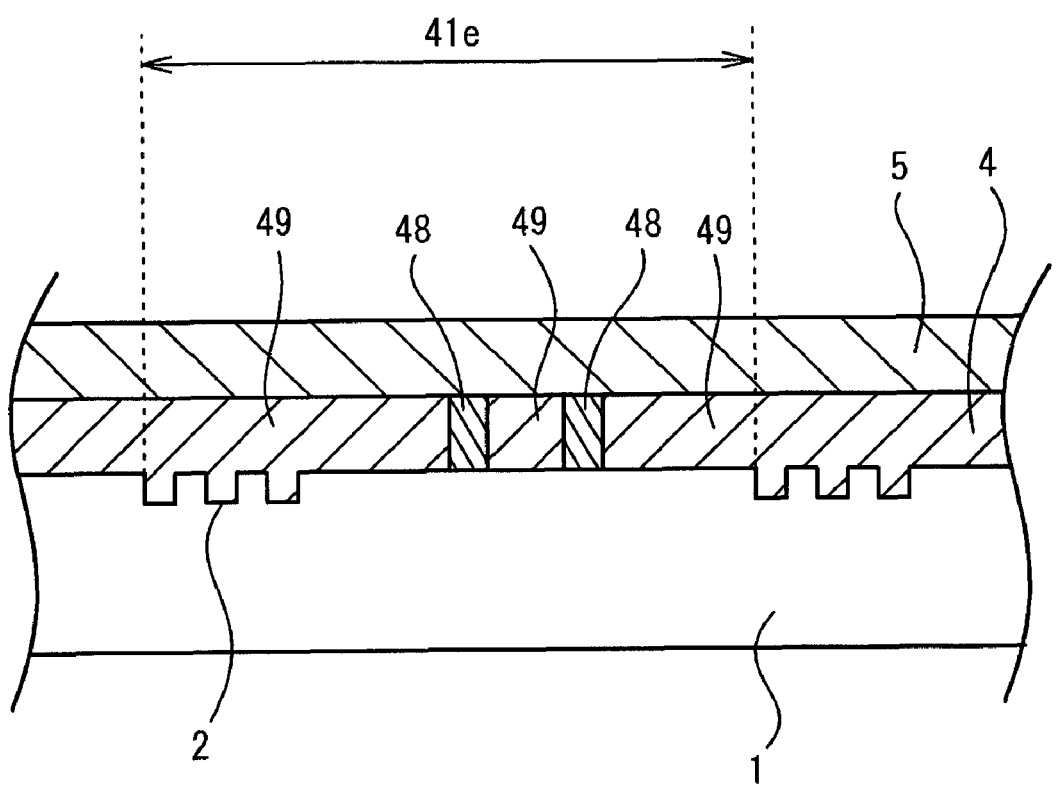
FIG. 17 illustrates another segment in accordance with the sixth embodiment.

The high-refractive-index portion 48 may be provided in the sampled diffractive grating 2. As shown in FIG. 17A, the high-refractive-index portion 48 may be divided into several parts in the segment 41e. The segment 41e may be provided in the SG-DR region A or in the SG-DFB region B. It is preferable that the segment 41e is provided at a position closer to the boundary between the SG-DR region A and the SG-DFB region B. The segment 41e may have a low-refractive-index region instead of the high-refractive-index portion 48, the low-refractive-index portion having a refractive index lower than that of the region 49. In this case, the effect of the present invention is obtained, when the difference between the refractive index of the low-refractive-index portion and that of the region 49 is adjusted so that the Δφ is −π/2. And, all of the segments except for one of the SG-DR region A and the SG-DFB region B may be the segment 41e. In this case, a phase of a light changes by 180 degrees, when the light travels back and forth in the segment 41e.

In the embodiment, the segment 41e corresponds to the first segment.

While the above description constitutes the preferred embodiments of the present invention, it will be appreciated that the invention is susceptible of modification, variation and change without departing from the proper scope and fair meaning of the accompanying claims.

The present invention is based on Japanese Patent Application No. 2005-376050 filed on Dec. 27, 2005 and Japanese Patent Application No. 2006-316887 filed on Nov. 24, 2006, the entire disclosure of which is hereby incorporated by reference.

What is claimed is:

1. A fabrication method of a semiconductor laser comprising:

coating a resist on a semiconductor layer;

exposing a plurality of diffractive grating patterns to the resist, each pitch of each diffractive grating pattern being substantially the same, wherein only one diffractive grating pattern having a convex portion or a concave portion of an optical length is an odd multiple of half of one pitch of each of the other diffractive gratings;

exposing a pattern having a plurality of space regions to the resist, the space region separating the diffractive grating pattern; and transferring a resist pattern formed by developing the resist to the semiconductor layer so as to form a first diffractive grating region and a second diffractive grating region, wherein the first diffractive grating region and the second diffractive grating region have a plurality of segments combined to each other each of the segments having a diffractive grating and a space region; and a segment to which the only one diffractive grating pattern is transferred is one of two segments of the first diffractive grating region or one of two segments of the second diffractive grating region that are on the boundary side between the first diffractive grating region and the second diffractive grating region.

2. The method as claimed in claim 1,
wherein an interference exposure is used in the step of exposing the diffractive grating pattern to the resist.

3. The method as claimed in claim 2,
wherein the resist is exposed with the diffractive grating pattern through a phase-shifting mask having a step.

4. The method as claimed in claim 1,
wherein an exposure mask having an opening corresponding to the space region is used in the step of exposing the pattern having the space regions to the resist.

* * * * *